(12) United States Patent
Silla et al.

(10) Patent No.: US 6,552,949 B1
(45) Date of Patent: Apr. 22, 2003

(54) REDUCING LEAKAGE CURRENT IN A MEMORY DEVICE

(75) Inventors: Mark Allen Silla, Hutto, TX (US); Arthur R Piejko, Austin, TX (US); Michael Louis Brauer, Austin, TX (US); Gerard Richard Williams, III, Sunset Valley, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 10/062,567

(22) Filed: Feb. 5, 2002

(51) Int. Cl.$^7$ ................................................ G11C 7/00
(52) U.S. Cl. ........................................ 365/227; 365/226
(58) Field of Search ................................ 365/227, 226, 365/229, 203, 207, 230.06

(56) References Cited

U.S. PATENT DOCUMENTS

| | | | |
|---|---|---|---|
| 5,521,874 A | * | 5/1996 | Sandhu .................... 365/189.11 |
| 5,905,688 A | * | 5/1999 | Park ............................ 365/226 |
| 6,249,473 B1 | * | 6/2001 | Lau et al. ...................... 365/222 |

* cited by examiner

Primary Examiner—Michael S. Lebentritt
Assistant Examiner—Anh Phung
(74) Attorney, Agent, or Firm—Nixon & Vanderhye P.C.

(57) ABSTRACT

The present invention relates to a memory device and method for reducing leakage current during a power down mode of operation. The memory device comprises a column of memory cells, with each memory cell being arranged to store a data value, and a pair of bit lines coupled to the column of memory cells. Bit line precharge circuitry is provided for precharging the pair of bit lines to a predetermined voltage level during a precharge phase, the pair of bit lines being arranged such that, when a particular memory cell in the column is selected in an evaluate phase following the precharge phase, a relative change in voltage level between the pair of bit lines indicates the data value stored within the selected memory cell. In accordance with the present invention, the memory device further comprises power down control circuitry arranged when the memory device is to enter a power down mode to prevent the bit line precharge circuitry from precharging the pair of bit lines, and selector circuitry arranged when the memory device is to enter the power down mode to ensure that none of the memory cells in the column are selected. It has been found that by taking this approach during the power down mode of operation, a significant reduction in the leakage current is observed.

42 Claims, 8 Drawing Sheets

REDUCING LEAKAGE CURRENT IN A MEMORY DEVICE

BACKGROUND OF THE INVENTION

1. Field of the Invention

The present invention relates to techniques for reducing leakage current in a memory device, and in particular to the reduction of leakage current in a memory device having memory cells coupled to bit lines, in situations where the memory device enters a power down mode of operation.

2. Description of the Prior Art

A memory device will typically comprise a plurality of memory cells arranged in rows and columns. For each column, a pair of bit lines is typically provided which is coupled to the column of memory cells, and in preferred embodiments is used to write data to, and read data from, individual memory cells within that column. Bit line precharge circuitry is typically used to precharge each pair of bit lines to a predetermined voltage level during a precharge phase, with the pair of bit lines being arranged such that, when a particular memory cell in the corresponding column is selected in an evaluate phase following the precharge phase, a relative change in voltage level between the pair of bit lines indicates the data value stored within the selected memory cell.

When a data processing system enters a power down (also referred to as a power saving) mode of operation, certain components may be shut down completely, with the power to those components being removed, whilst other components may enter an inactive state where they are not actively consuming power (e.g. internal nodes are not changing state), but where the power supply is still maintained to the component. This may be appropriate in order to ensure that the state of the component is not lost during the power down mode. A memory device such as a cache would be a typical example of a component which during a power saving mode of operation may still have the power supply provided to it to ensure that the contents of the cache memory do not need to be stored to external memory before the power down mode is entered. If this was not done, and the power supply was removed, the data in the cache would be lost.

However, when a memory device of the above type is subject to a power saving mode where the power supply is still provided to the device, there is a tendency for some leakage current to flow via the bit lines during the power saving mode.

Up to now, the issue of leakage current has typically not been of significant concern in many implementations. However, as components decrease in size, it has been found that leakage current tends to increase. Hence, it would be desirable to develop techniques which enable a reduction in the leakage current when a memory device is placed in a power saving mode of operation. Clearly, this becomes even more desirable when seeking to develop systems which are increasingly more power efficient.

SUMMARY OF THE INVENTION

Viewed from a first aspect, the present invention provides a memory device, comprising: a column of memory cells, each memory cell being arranged to store a data value; a pair of bit lines coupled to said column of memory cells; bit line precharge circuitry for precharging said pair of bit lines to a predetermined voltage level during a precharge phase, the pair of bit lines being arranged such that, when a particular memory cell in said column is selected in an evaluate phase following said precharge phase, a relative change in voltage level between the pair of bit lines indicates the data value stored within the selected memory cell; power down control circuitry arranged when the memory device is to enter a power down mode to prevent the bit line precharge circuitry from precharging said pair of bit lines; and selector circuitry arranged when the memory device is to enter said power down mode to ensure that none of said memory cells in said column are selected.

In accordance with the present invention, a memory device having a column of memory cells, a pair of bit lines coupled to the column of memory cells, and bit line precharge circuitry, is further provided with power down control circuitry arranged, when the memory device is to enter a power down mode of operation, to prevent the bit line precharge circuitry from precharging the pair of bit lines. Further, selector circuitry is arranged when the memory device is to enter the power down mode to ensure that none of the memory cells in the column are selected. By this approach, it is ensured that the bit lines are no longer "strongly" driven to the predetermined voltage level, the use of the term "strongly" in this case being intended to indicate the act of being driven by a "turned-on" device. Hence, in effect, this approach leaves the bit lines floating in the power down mode of operation.

Surprisingly, it has been found that this approach significantly reduces the leakage current that would otherwise flow through the bit lines, and the memory cells coupled to those bit lines. On further analysis, the inventors of this invention have realised that this is due to the fact that a path of significant leakage current is altered by taking the above described steps when entering the power down mode of operation, and that this altered path exhibits a significantly increased resistance to current flow when compared with the unaltered leakage current path observed in typical prior art memory devices.

More particularly, it was found that whereas in the typical prior art memory device, the path of significant leakage current passed through the precharge circuitry, bit lines, and particular components of the memory cell, when the memory device was arranged in accordance with the present invention, the path of significant leakage current instead passed via the bit lines between memory cells in a particular column that are storing different data values. This latter path typically has a significantly increased resistance compared with the above described significant leakage current path of prior art memory devices, which leads to the observed reduction in leakage current.

The power down control circuitry may be arranged in a variety of ways, provided that it serves to prevent the bit line precharge circuitry from precharging the pair of bit lines when the memory device enters the power down mode of operation. However, in one embodiment of the present invention, the power down control circuitry is arranged to receive a power down signal indicating whether the power down mode is set and a precharge signal indicating whether the precharge phase is active, and to generate as its output an input signal to the bit line precharge circuitry, such that when the power down signal indicates that the power down mode is set, the output signal from the power down control circuitry is arranged to cause the bit line precharge circuitry to be turned off.

In such an embodiment, the bit line precharge circuitry preferably comprises one or more P type devices, and said power down control circuitry is arranged to apply a logical OR gate function to the power down signal and the precharge signal. In such an embodiment, the precharge signal will be set to a logic 0 level when the apparatus is in the precharge phase and to a logic 1 level when the apparatus is not in the precharge phase, whilst the power down signal will be set to a logic 1 level when the power down mode is to be entered, and will be set to a logic 0 level otherwise. Accordingly, since the power down control circuitry is arranged to apply a logical OR gate function, it is clear that when the power down signal is set to a logic 1 level, a logic 1 signal will be output by the power down control circuitry to the bit line precharge circuitry, and given that the bit line precharge circuitry comprises one or more P type devices, this will cause the bit line precharge circuitry to be turned off.

In an alternative embodiment, the power down control circuitry is positioned in series with the bit line precharge circuitry between the pair of bit lines and the predetermined voltage level, the power down control circuitry being arranged to receive a power down signal indicating whether the power down mode is set and to turn off when the power down signal indicates that the power down mode is set, thereby preventing the bit line precharge circuitry from precharging said pair of bit lines to said predetermined voltage level. Hence, in this embodiment, the power down control circuitry effectively decouples the bit line precharge circuitry from the predetermined voltage level and/or the pair of bit lines when the memory device is to enter the power down mode of operation. In one embodiment, the power down control circuitry may comprise a P type device and the power down signal is arranged to be set to a logic 1 level when the power down mode is to be entered, whereby application of that power down signal as an input to the P type device causes the P type device to be turned off. Preferably, in such embodiments, the P type device is a P type transistor.

It will be appreciated that the above described invention may be applicable to a variety of different memory device structures. However, in preferred embodiments, the memory cells of the memory device are Random Access Memory (RAM). More particularly, in preferred embodiments, each memory cell comprises a cross-coupled pair of inverter circuits for storing a data value.

It will be appreciated that the selector circuitry used to ensure that none of the memory cells in the column are selected when the memory device is to enter the power down mode of operation may take a variety of forms. However, in preferred embodiments, each memory cell is coupled to each bit line in said pair of bit lines via a memory cell select device, the selector circuitry being arranged to ensure that each memory cell select device is turned off when the memory device is in said power down mode.

Whilst it has been found that significant reductions in the leakage current can be obtained by use of embodiments of the present invention as described above, it has been found that further reductions in the leakage current can be obtained by also including within the memory device voltage regulating circuitry arranged when the memory device is to enter the power down mode to reduce the difference between the predetermined voltage level and a reference voltage level. Since each memory cell in preferred embodiments has components coupled between the predetermined voltage level and the reference voltage level, and given that it has been observed by the inventors that the path of significant leakage current when employing techniques in accordance with preferred embodiments of the present invention passes from one memory cell to another memory cell in the column via one of the bit lines, then it has been found that a reduction in the potential difference between the predetermined voltage level and the reference voltage level further serves to reduce the leakage current. In preferred embodiments, the predetermined voltage level is set to a supply voltage $V_{DD}$, whilst the reference voltage level is set to ground, and in such embodiments the voltage regulating circuitry is arranged to decrease the value of $V_{DD}$ when entering the power down mode in order to decrease the difference between the predetermined voltage level and the reference voltage level.

In one embodiment of the present invention, one pair of bit lines is coupled to each column of memory cells. However, it will be appreciated by those skilled in the art that some memory device architectures include a plurality of pairs of bit lines coupled to each column of memory cells to provide more flexibility in addressing of memory cells, and it will be appreciated that the techniques of preferred embodiments of the present invention are equally applicable to such memory device architectures.

In preferred embodiments, the memory device further comprises: a plurality of said columns of memory cells; a corresponding plurality of said pairs of bit lines; a plurality of word lines, each word line being coupled to one of said memory cells in each column; said selector circuitry being arranged to drive one of said word lines in said evaluate phase to cause the memory cells coupled to that word line to be selected.

In such embodiments, the selector circuitry preferably comprises: a dynamic node coupled to a corresponding word line; dynamic node precharge circuitry arranged during said precharge phase to precharge the dynamic node to a first voltage level; evaluation circuitry arranged to receive a number of input signals and during said evaluate phase to selectively drive the dynamic node to a second voltage level dependent on the input signals; and power down drive circuitry arranged when the selector circuitry is to enter a power down mode to drive the dynamic node to the second voltage level.

Hence, in such preferred embodiments of the present invention, the selector circuitry has a dynamic node, dynamic node precharge circuitry and evaluation circuitry, and is further provided with power down drive circuitry arranged, when the memory device is to enter a power down mode, to drive the dynamic node to the second voltage level. The aim of this is to substantially remove the leakage current that otherwise is observed through the evaluation circuitry due to the difference between the first and second voltage levels. Whilst the approach of causing the power down drive circuitry to drive the dynamic node to the second voltage level when entering a power down mode does result in leakage current occurring through the dynamic node precharge circuitry, due to the potential difference between the first and second voltage levels, it has been found that this leakage current is significantly less than the leakage current typically flowing through the evaluation circuitry. This is due to the fact that in practice the evaluation circuitry typically includes significantly more components placed in parallel between the dynamic node and the second voltage level than the components within the dynamic node precharge circuitry placed between the dynamic node and the first voltage level, and accordingly by ensuring that in the power down mode the potential difference is placed across the dynamic node precharge circuitry rather than the evaluation circuitry, the leakage current occurring during the power down mode can be significantly reduced.

Hence, in accordance with preferred embodiments of the present invention, not only is a reduction in the leakage current flowing via the bit lines of the memory device obtained, but also a reduction in the leakage current occurring within the selector circuitry is also obtained, hence providing a particularly power efficient arrangement.

It should be noted that the approach taken by the inventors of the present invention is entirely counter intuitive, as typically it would be thought desirable to keep the dynamic node at the precharged first voltage level during a power down mode, to reduce the power that needs to be consumed to return the dynamic node to the first voltage level following the exit from the power down mode back to the normal mode of operation. However, the inventors have noted that in many implementations the memory device may be placed into the power down mode of operation for a significant length of time, and have found that the power savings to be obtained by reducing the leakage current in accordance with embodiments of the present invention significantly outweigh the power consumption required to return the dynamic node to the first voltage level upon exiting the power down mode of operation.

In preferred embodiments, the memory device further comprises coupling logic arranged to couple said dynamic node to said corresponding word line, such that in said evaluate phase if said evaluation circuitry drives said dynamic node to said second voltage level, the corresponding word line is not driven. Since in the power down mode of operation, the dynamic node is driven to the second voltage level, then it is clear that the corresponding word line will not be driven in the power down mode of operation.

The power down drive circuitry may be arranged in a variety of ways, provided that it serves to drive the dynamic node to the second voltage when the power down mode is entered. However, in one embodiment of the present invention, the power down drive circuitry comprises first circuitry responsive to a power down signal indicating that the power down mode is set to drive the dynamic node to the second voltage level and second circuitry responsive to said power down signal to prevent the dynamic node precharge circuitry from precharging the dynamic node to the first voltage level. Hence, in such embodiments, a first part of the circuitry is involved in driving the dynamic node to the second voltage level, whilst the second part of the circuitry is responsible for ensuring that the dynamic node precharge circuitry is prevented from precharging the dynamic node back to the first voltage level.

In such embodiments, the first circuitry preferably comprises an N type device connected between the dynamic node and the second voltage level. In one particular implementation, the N type device is an N-type transistor arranged to receive at its gate the power down signal. The power down signal is set to a voltage sufficient to turn the N type transistor on when the power down mode of operation is to be entered, thereby causing the dynamic node to be driven to the second voltage level.

In one embodiment of the present invention, the second circuitry is arranged to receive the power down signal and a precharge signal indicating whether the precharge phase is active, and to generate as its output an input signal to the dynamic node precharge circuitry, such that when the power down signal indicates that the power down mode is set, the output signal from the second circuitry is arranged to cause the dynamic node precharge circuitry to be turned off.

In such an embodiment, the dynamic node precharge circuitry preferably comprises one or more P type devices, and said second circuitry is arranged to apply a logical OR gate function to the power down signal and the precharge signal. In such an embodiment, the precharge signal will be set to a logic 0 level when the apparatus is in the precharge phase and to a logic 1 level when the apparatus is not in the precharge phase, whilst the power down signal will be set to a logic 1 level when the power down mode is to be entered, and will be set to a logic 0 level otherwise. Accordingly, since the second circuitry is arranged to apply a logical OR gate function, it is clear that when the power down signal is set to a logic 1 level, a logic 1 signal will be output by the second circuitry to the dynamic node precharge circuitry, and given that the dynamic node precharge circuitry comprises one or more P type devices, this will cause the dynamic node precharge circuitry to be turned off.

In an alternative embodiment, the second circuitry is positioned in series with the dynamic node precharge circuitry between the dynamic node and the first voltage level, the second circuitry being arranged to turn off when the power down signal indicates that the power down mode is set, thereby preventing the dynamic node precharge circuitry from precharging the dynamic node to the first voltage level. Hence, in this embodiment, the second circuitry effectively decouples the dynamic node precharge circuitry from the first voltage level and/or the dynamic node when the memory device is to enter the power down mode of operation. In one embodiment, the second circuitry may comprise a P type device, and the power down signal is arranged to be set to a logic 1 level when the power down mode is to be entered, whereby application of that power down signal as an input to the P type device causes the P type device to be turned off. Preferably, in such embodiments, the P type device is a P type transistor.

In preferred embodiments, the first voltage level represents a logic 1 level and the second voltage level represents a logic 0 level. However, it will be appreciated that the present invention is equally applicable where the first voltage level represents a logic 0 level and the second voltage level represents a logic 1 level.

In such preferred embodiments where the first voltage level represents a logic 1 level and the second voltage level represents a logic 0 level, then preferably the evaluation circuitry comprises a plurality of N type devices. In preferred embodiments, these N type devices are N type transistors. In preferred embodiments, the plurality of N type transistors consists of a number of sets of one or more N type transistors, with the various sets being located in parallel between the dynamic node and the second voltage level.

Further, in such preferred embodiments, the dynamic node precharge circuitry preferably comprises one or more P type devices. In preferred embodiments, these one or more P type devices are P type transistors. In one preferred embodiment, the dynamic node precharge circuitry consists of one P type transistor coupled between the dynamic node and the first voltage level.

Whilst it has been found that significant reductions in the leakage current can be obtained by use of embodiments of the present invention as described above, it has been found that further reductions in the leakage current can be obtained by also including within the memory device voltage regulating circuitry arranged when the memory device is to enter the power down mode to reduce the difference between the first voltage level and the second voltage level, thereby reducing leakage current through the dynamic node precharge circuitry. As mentioned previously, when employing the techniques of preferred embodiments of the present invention, the leakage current observed in the selector circuitry occurs predominantly through the dynamic node precharge circuitry and since this leakage current is governed by the potential difference between the first voltage level and the second voltage level, reduction in the potential difference via the voltage regulating circuitry enables the leakage current to be reduced still further. In preferred embodiments, the first voltage level is set to a supply voltage $V_{DD}$, whilst the second voltage level is set to ground, and in such embodiments the voltage regulating circuitry is arranged to decrease the value of $V_{DD}$ when entering the power down mode in order to decrease the difference between the first voltage level and the second voltage level.

Viewed from a second aspect, the present invention provides a method of operating a memory device to reduce leakage current in a power down mode of operation, the memory device comprising a column of memory cells, each memory cell being arranged to store a data value, a pair of bit lines coupled to said column of memory cells, and bit line precharge circuitry for precharging said pair of bit lines to a predetermined voltage level during a precharge phase, the pair of bit lines being arranged such that, when a particular memory cell in said column is selected in an evaluate phase following said precharge phase, a relative change in voltage level between the pair of bit lines indicates the data value stored within the selected memory cell, the method comprising the steps of (a) preventing the bit line precharge circuitry from precharging said pair of bit lines when the memory device is to enter a power down mode; and (b) ensuring that none of said memory cells in said column are selected when the memory device is to enter said power down mode.

BRIEF DESCRIPTION OF THE DRAWINGS

The present invention will be described further, by way of example only, with reference to a preferred embodiment thereof as illustrated in the accompanying drawings, in which.

DESCRIPTION OF A PREFERRED EMBODIMENT

Figure 1:
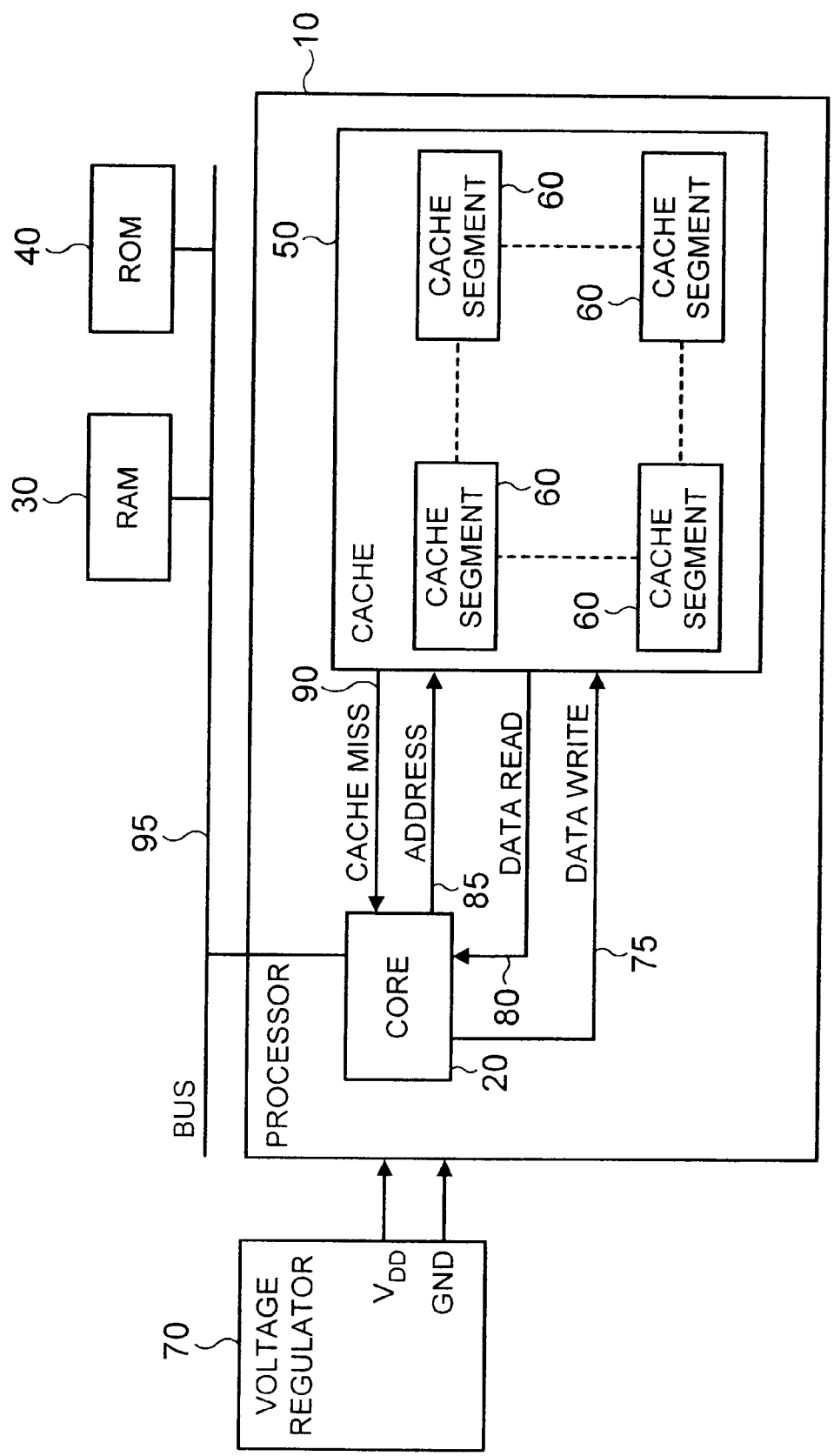
FIG. 1 is a block diagram of a data processing system in which a preferred embodiment of the present invention may be implemented.

FIG. 1 is a block diagram of a data processing system in which the techniques of preferred embodiments of the present invention may be employed. In preferred embodiments, a processor 10 includes a core 20 and a cache 50 consisting of a plurality of cache segments 60. The processor core 20 is connected to a main bus 95 via which it may be connected to other components of the data processing system, for example a Read Only Memory (ROM) 40 and a Random Access Memory (RAM) 30. The cache 50 is connectable to the main bus 95 via the processor core 20.

The processor 10 is arranged to receive its power supply from a voltage regulator 70, the voltage regulator outputting two voltage levels, namely $V_{DD}$ (representing a logic 1 level) and a ground signal (representing a logic 0 level). It will be appreciated by those skilled in the art that these signals are also provided to other components within the data processing system, but for the sake of clarity these connections have been omitted.

As will be appreciated by those skilled in the art, the core 20 is arranged to execute a sequence of instructions obtained from the RAM 30 and/or ROM 40, with the cache 50 being arranged to store some instructions and/or data so that they are available quickly to the core 20 as and when required.

When the core 20 determines that it needs an instruction or a data value, it will issue the address for that instruction or data value over path 85 to the cache 50, whereupon the cache 50 will refer to the cache segments 60 to determine whether the instruction or data value specified by that address is stored within the cache. If it is, then the relevant instruction or data value will be output from the cache to the core over path 80. However, if the instruction or data value specified by the address is not found within the cache 50, then a cache mis-signal will be returned to the core over path 90, whereupon the core 20 will cause the required instruction or data value to be retrieved from external memory.

Similarly, if the core 20 determines that it wishes to write an instruction or data value into the cache, then it will output the address of that instruction or data value over path 85, and output the relevant instruction or data value over path 75, whereupon the cache 50 will cause that instruction or data value to be written into one of the cache segments 60. As the basic operation of caches will be appreciated by those skilled in the art, and is not relevant to the teaching of preferred embodiments of the present invention, further details will not be provided herein.

FIG. 1 illustrates a unified cache structure. However, it will be appreciated that the techniques of preferred embodiments of the present invention are equally applicable to other cache structures, for example structures having separate data and instruction caches.

Figure 2:
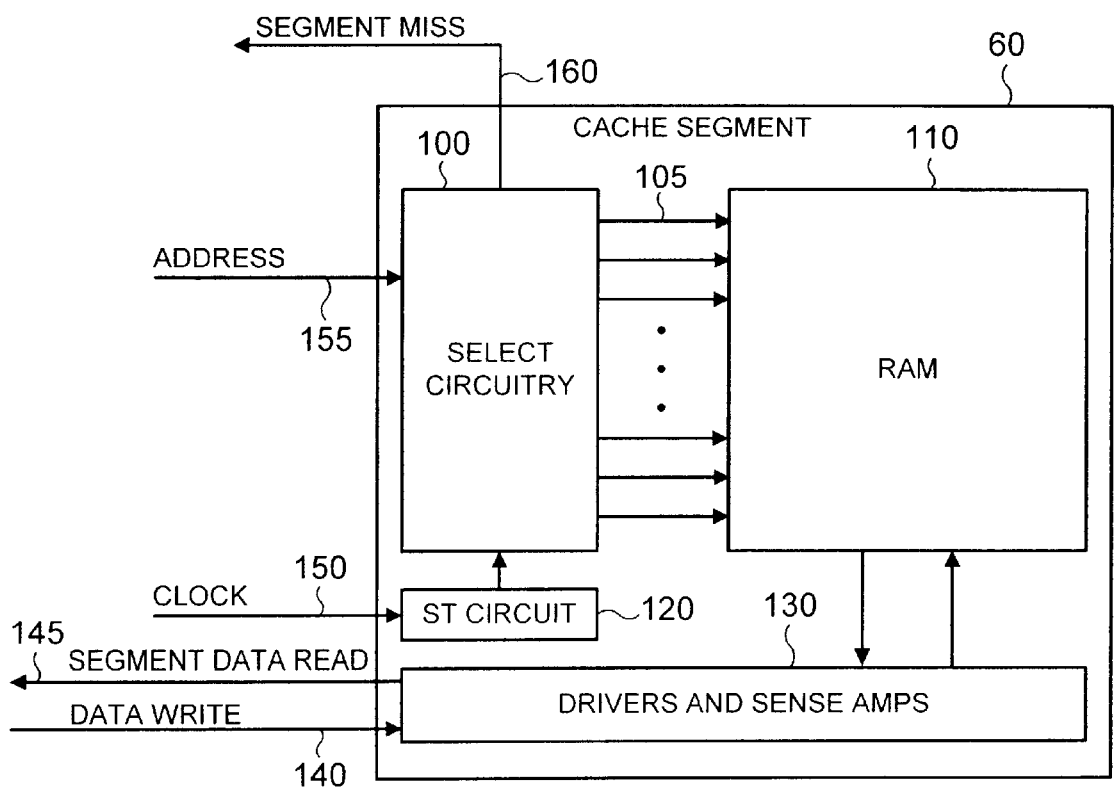
FIG. 2 is a block diagram illustrating in more detail components provided within a cache segment of the cache illustrated in FIG. 1.

FIG. 2 illustrates in more detail components found within each cache segment 60 illustrated in FIG. 1. Each cache segment 60 includes selector circuitry 100 used to determine whether an instruction or data value specified by an address received over path 155 is to be found within a block of RAM 110 provided within the cache segment, and to generate output signals over path 105 to drive the appropriate word line of the RAM if it is determined that the instruction or data value having that address is contained within the RAM 110 (referred to as a "cache hit"). Driver and Sense Amp circuitry 130 is provided to control reading from and writing to the RAM 110, and accordingly for a cache write the driver/sense amp circuitry 130 is arranged to receive the instruction or data value to be written over path 140 and to pass that instruction or data value onto the RAM 110, whilst during a cache read process, the driver/sense amp circuitry 130 is arranged to receive the instruction or data value from the RAM 110 in the event of a cache hit, and to output that instruction or data value over path 145.

It will be appreciated by those skilled in the art that the "address" specified over path 155 may take a variety of forms. For example, rather than the address per se, the "address" may be specified as a representation of the address, this representation for example being formed by decoding some address bits and changing the format of the address. Also, references to addresses may include associativity in certain implementations.

If the selector circuitry 100 determines that the instruction or data value having the address specified over path 155 is not present within the RAM 110 of the cache segment 60, then it will issue a segment miss signal over path 160. As will be discussed in more detail later, the select circuitry 100 includes a plurality of dynamic node circuits, one associated with each word line of the RAM 110, each dynamic node circuit including evaluation circuitry which is arranged during an evaluation phase to selectively alter the voltage on its corresponding dynamic node dependent of the inputs received to the evaluation circuitry. Since the inputs to the evaluation circuitry will take a finite period of time to set up, a self timing circuit 120 is provided which is responsive to the main system clock signal received over path 150 to issue a signal to the select circuitry 100 when it is determined that sufficient time has elapsed for the inputs to the various dynamic node circuits to have been set up correctly, this then triggering the evaluation phase to take place.

With regard to the correspondence between the signals illustrated in FIG. 1 and the signals illustrated in FIG. 2, it will be appreciated that appropriate parts of the address output over path 85 from the core 20 to the cache 50 will be passed to each of the cache segments 60, and accordingly the relevant parts of the address will appear on path 155 to the particular cache segment 60 illustrated in FIG. 2. Similarly, the instruction or data value output over path 75 from the core in the event of a cache write will be replicated to each of the cache segments, and hence will correspond directly with the signal received by the driver and sense amp circuitry 130 over path 140. With regard to the cache miss signal output from the cache 50 over path 90 to the core 20, this will be obtained by muxing together all of the segment miss signals output over path 160 from each of the cache segments 60. Similarly, muxing will be provided to determine which of the segment data read signals output over path 145 from each cache segment 60 to output on to the data read path 80 to the core 20. It will be appreciated that in the event of a cache read, only one cache segment 60 should produce a cache hit, and accordingly valid data will only be output from one of the cache segments 60.

Figure 3A:
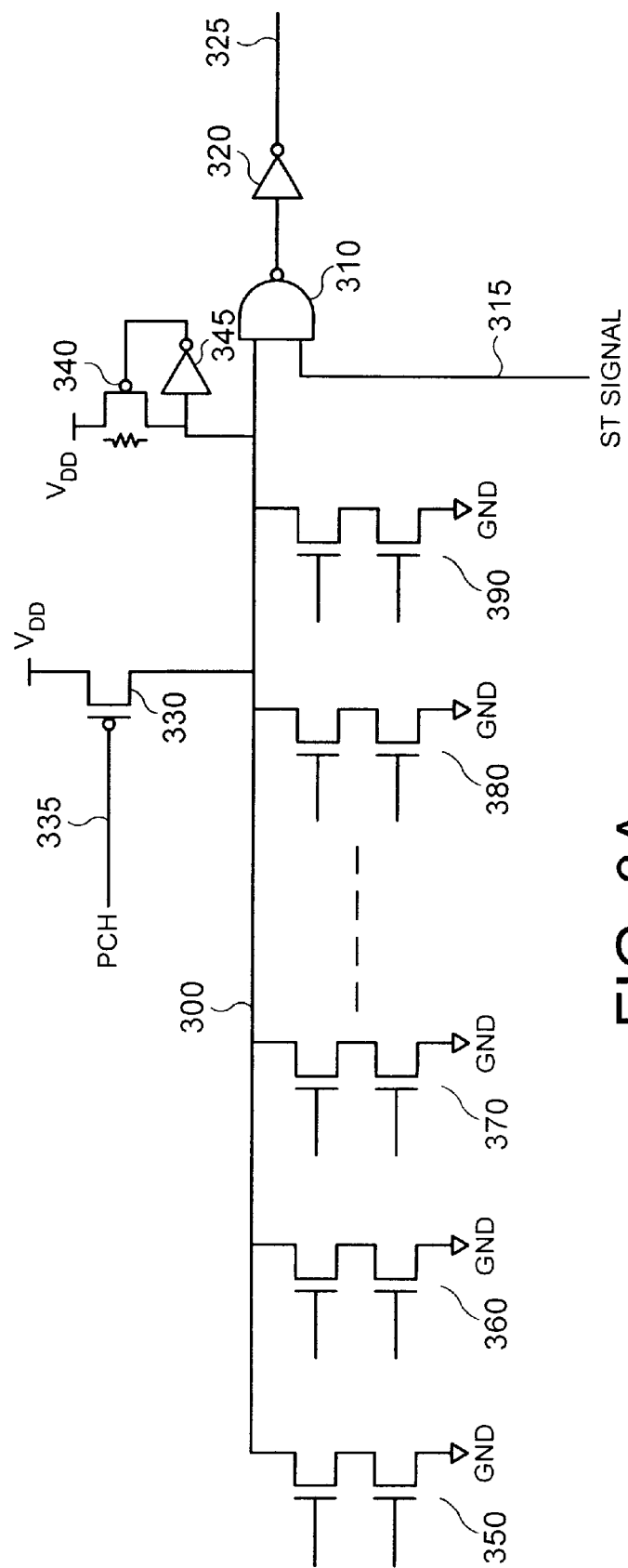
FIG. 3A is a block diagram of a typical selector circuitry arrangement used to drive a word line in accordance with known prior art techniques.

FIG. 3A is a block diagram illustrating the construction of a typical dynamic node circuit that may be found within the select circuitry 100 of FIG. 2 in a prior art system. As shown in FIG. 3A, the dynamic node 300 is connected to a corresponding word line 325 via a NAND gate 310 and an inverter 320. Precharge circuitry 330 is provided between the voltage source $V_{DD}$ and the dynamic node 300, such that in a precharge phase the dynamic node 300 will be precharged to the voltage level $V_{DD}$ (hereafter referred to as the first voltage level). As shown in FIG. 3A, the precharge circuitry 330 will typically consist of a single P type transistor, such that when a precharge signal input over path 335 goes to a logic 0 level to indicate the precharge phase, the transistor 330 conducts and accordingly draws the dynamic node 300 to the first voltage level.

Evaluation circuitry is provided within the dynamic node circuitry, consisting of sets of N type transistors, for example sets 350, 360, 370, 380 and 390, provided in parallel between the dynamic node 300 and the ground voltage level (hereafter referred to as the second voltage level). As will be appreciated by those skilled in the art, during the evaluate phase, these sets of transistors receive various inputs, and dependent on those inputs one or more of the sets of transistors may discharge the dynamic node 300 to the second voltage level.

In preferred embodiments, the circuitry is arranged such that the select circuitry 100 compares an address received over path 155 with the addresses of each of the instructions or data values stored within the RAM 110, such that if there is a match the dynamic node of one of the dynamic node circuits provided within the select circuitry 100 will remain at the first voltage level, whilst the dynamic nodes of all of the remaining dynamic node circuits within the select circuitry 100 will discharge to the second voltage level.

The evaluation circuitry illustrated in FIG. 3A is arranged to compare address (and optionally attribute bits, e.g. valid bits) of the received address with the address (and optionally attribute bits) of the instruction or data value stored in the corresponding word line 325. In preferred embodiments, one of the transistors in each pair 350, 360, 370, 380 and 390 (e.g. the upper one) receives at its gate a signal representing the result of applying an XOR function to a received address bit (or attribute bit) and the corresponding bit of the address (or attribute bit) of the instruction or data value stored in the corresponding word line. Hence, this signal will have a logic one value if the compared bits differ, and a logic 0 value if they are identical. Hence, it can be seen that the transistor will only turn on if the compared bits differ.

The other transistor in each pair 350, 360, 370, 380, 390 (e.g. the lower one) is arranged to received a logic one at its gate when the evaluation circuitry is to evaluate the results of the comparison (i.e. when the input signals to the other transistor in each pair is deemed to reflect the result of the comparison). Hence, it can be seen that the dynamic node will be discharged to the second voltage level whenever any single bit of the received address (or attribute information) differs from that relating to the instruction or data value in the corresponding word line.

The NAND gate 310 is connected to the dynamic node 300 and is also arranged to receive a self timed signal over path 315 from the self timed circuit 120 illustrated in FIG. 2. In preferred embodiments, the self timed circuit 120 is arranged to issue the self timed signal at a logic 1 level a predetermined period after the rising edge of the main clock signal 150, this predetermined period being chosen so as to ensure that all of the inputs to the various sets of transistors 350, 360, 370, 380, 390 of the evaluation circuitry have been set to the required levels before the evaluation takes place.

As will be appreciated by those skilled in the art, the NAND gate 310 is arranged to output a logic 1 level in all situations except for when both of its inputs are at a logic 1 level, in which event it will output a logic 0 value. Accordingly, NAND gate 310 will only output a logic 0 value if the dynamic node 300 is still set to the first voltage level when the self timed signal over path 315 transitions to the logic 1 level, this being the situation where a cache hit will have been detected. When a logic 0 level is output from the NAND gate 310, the inverter 320 will convert this to a logic 1 level for outputting on the corresponding word line 325, thereby causing the appropriate cache line within the RAM 110 to be selected for reading or writing.

The circuitry 340, 345 is referred to in the art as a "keeper" circuit and its role is to maintain the voltage level on the dynamic node 300. The P type transistor 340 is a weak transistor, and so will be overridden by the other transistors in the circuit, specifically the transistors of the precharge circuitry and the evaluation circuitry, and accordingly the presence of the P type transistor 340 will not affect the operation of the dynamic node circuit. As will be appreciated by those skilled in the art, if the dynamic node 300 is at a logic 1 level, the output from the inverter 345 will be at a logic 0 level, which will turn the P type transistor 340 on, and maintain the dynamic node at the logic 1 level. However, if one of the sets of transistors 350, 360, 370, 380, 390 cause the dynamic node to be discharged to the logic 0 level, the inverter 345 will output a logic 1 level to the P type transistor 340, thereby turning it off and maintaining the dynamic node 300 at the second voltage level.

Figure 3B:
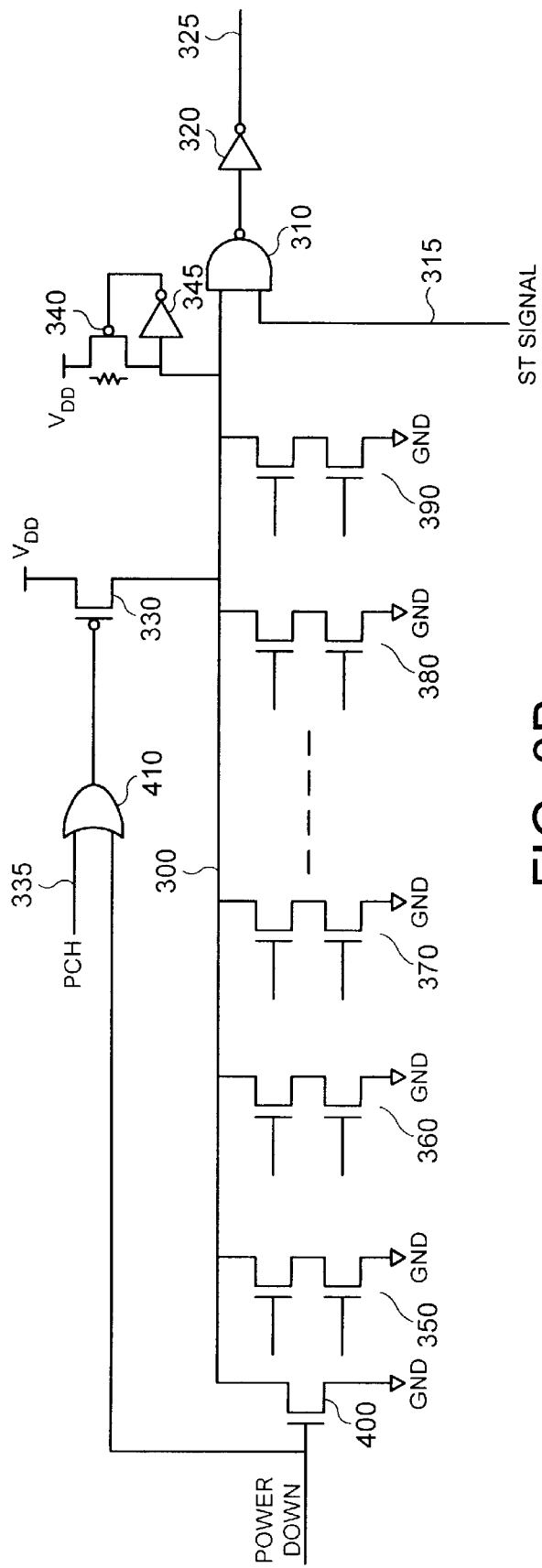
FIG. 3B is a block diagram illustrating a first embodiment of selector circuitry which may be used in preferred embodiments of the present invention.

In accordance with preferred embodiments of the present invention, the dynamic node circuit of FIG. 3A is adapted to include power down drive circuitry to drive the dynamic node 300 to the second voltage level when the select circuitry 100 is to enter a power down mode. More specifically, in a first embodiment as illustrated in FIG. 3B, the power down drive circuitry consists of an N type transistor 400 and an OR gate 410, both of which are arranged to receive a power down signal which is set to a logic 1 level when the power down mode is to be entered. As will be appreciated by those skilled in the art, the presence of a logic 1 power down signal will cause the transistor 400 to drive the dynamic node 300 to the second voltage level (i.e. ground), and will also cause the OR gate 410 to output a logic 1 signal to the precharge transistor 330 irrespective of the value of the precharge signal received at the other input of OR gate 410. The presence of a logic 1 input to the precharge transistor 330 will cause the precharge transistor to turn off, and hence prevent the precharge transistor from seeking to pull the dynamic node to the first voltage level (i.e. $V_{DD}$). The remaining circuitry remains unchanged.

In a typical power down mode applied to the cache, the power supply will still be maintained to the cache to avoid having to store the contents of the cache to external memory before entering the power down mode. By including this extra power down drive circuitry, it can be ensured that the dynamic node is driven to the second voltage level whenever the power down mode of operation is entered. This significantly reduces the leakage current of the dynamic node circuit, since the most significant leakage current will now occur across the P type transistor 330, and this has been found to be significantly less than the leakage current which would otherwise occur across the evaluation circuitry 350, 360, 370, 380, 390 were the dynamic node left at the first voltage level during the power down mode. This is due to the fact that the evaluation circuitry contains a significant number of transistors in parallel between the dynamic node and the second voltage level, whereas the precharge circuitry includes far less transistors between the first voltage level and the dynamic node, in preferred embodiments there being only one precharge transistor.

Since during the power down mode, the circuit of FIG. 3B will have caused the dynamic node to transition to the second voltage level, it will be necessary to precharge the dynamic node back up to the first voltage level when the power down mode is exited, and this will consume some power. Nevertheless, it has been found that there are many implementations where the power down mode is entered for a significant period of time, and in such implementations it has been found that the saving in leakage current outweighs the power subsequently needed to precharge the dynamic node back up to the first voltage level when the power down mode is exited.

Figure 3C:
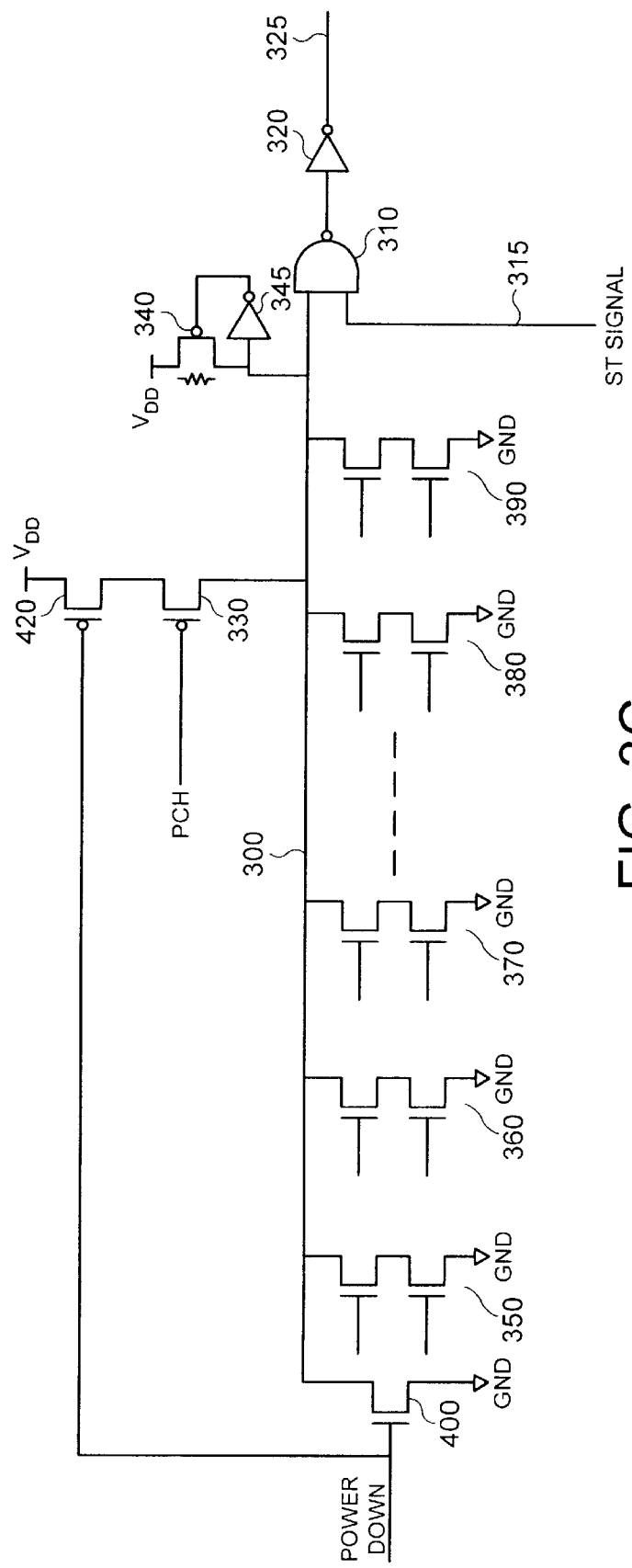
FIG. 3C is a block diagram illustrating a second embodiment of selector circuitry which may be used in preferred embodiments of the present invention.

FIG. 3C illustrates an alternative embodiment to the dynamic node circuit of FIG. 3B, where instead of the OR gate 410, a further P type transistor 420 is provided is series with the precharge transistor 330 between the first voltage level and the dynamic node 300. As will be appreciated by those skilled in the art, when the power down signal is set to a logic 1 level to indicate that the power down mode is to be entered, this will cause the P type transistor 420 to turn off, thereby decoupling the precharge transistor 330 from the first voltage level (i.e. $V_{DD}$), and thereby preventing the precharge transistor from precharging the dynamic node 300 to the first voltage level. Accordingly, the N type transistor 400 will be able to drive the dynamic node 300 to the second voltage level upon receipt of the power down signal.

Given that in the power down mode the dynamic node 300 will be driven to the logic 0 level, then the NAND gate 310 will output a logic 1 value irrespective of the value of the self-timed signal on path 315, which will cause the inverter 320 to output a logic 0 value on the corresponding word line, thereby causing the word line not to be driven during the power down mode.

To further reduce the leakage current, it is possible to arrange the voltage regulating circuit of FIG. 1 to reduce the difference between the first and second voltage levels (preferably by reducing the value of the voltage $V_{DD}$) when the power down mode is entered.

Figure 4A:
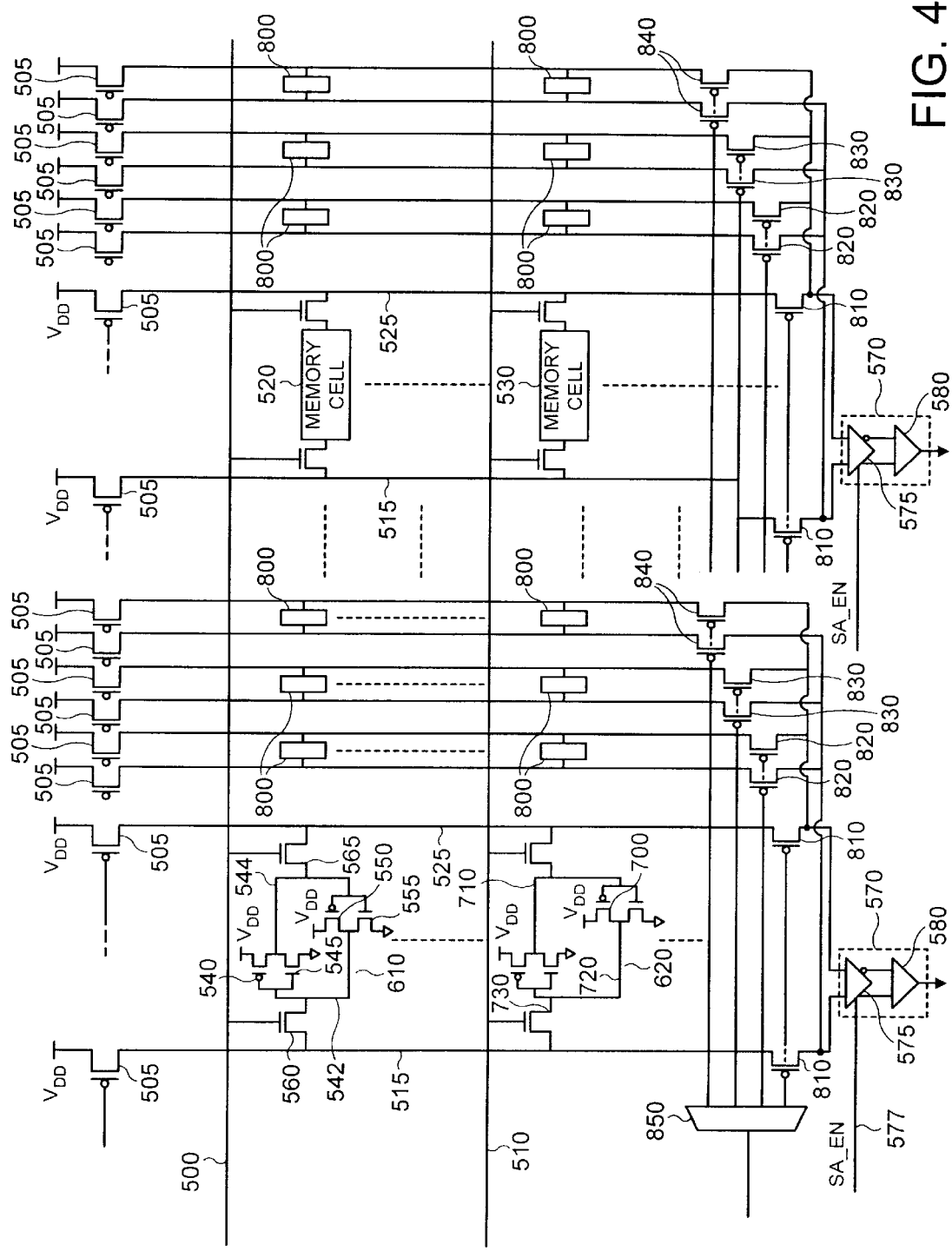
FIG. 4A is a diagram illustrating the arrangement of memory cells within a Random Access Memory (RAM) in accordance with known prior art techniques.

FIG. 4A is a diagram illustrating a typical arrangement of a RAM 110 within the cache segment 60 of a prior art device. The RAM 110 will consist of a plurality of columns of memory cells 520, 530, 610, 620, with a pair of bit lines 515, 525 coupled to each column of memory cells. Word lines 500, 510, etc run through the RAM 110, and each word line is coupled to one memory cell from each column. The memory cells coupled to a particular word line are referred to as a row, and are used to store an instruction or a data item.

As shown in FIG. 4A, in preferred embodiments the columns of memory cells are arranged in groups of four, each group of four columns being coupled to sense amp circuitry 570 which accesses a particular column in the group via a 4:1 multiplexer 850. In particular, the 4:1 mux 850 will generate appropriate signals to cause one of the pairs of transistors 810, 820, 830, 840 to turn on and thus connect the corresponding column's bit lines to the sense amp circuitry 570. In preferred embodiments, each memory cell stores one bit of information, and accordingly if the instructions or data items are 32 bits (one word) in length, the row will typically consist of 128 (32×4) memory cells connected to a particular word line, thus allowing our words to be stored in a word line.

During a precharge phase, precharge transistors 505 are arranged to receive at heir input a logic 0 signal, thereby causing the bit lines 515, 525 to be precharged to a logic 1 level. When during the evaluation stage, one of the word lines, 500, 510 is driven with a logic 1 level to indicate a cache hit, this will cause one of the two bit lines 515, 525 to start to discharge, the particular value of the bit stored within the relevant memory cell determining which of the two bit lines begins to discharge.

As will be appreciated by those skilled in the art, each pair of bit lines is coupled to sense amp circuitry 570 via the 4:1 mux 850, which in preferred embodiments consists of a sense amp 575 and a tri-state buffer 580, the sense amp 575 receiving a sense amp enable signal over path 577 to cause it to sense the two voltages on the corresponding pair of bit lines 515, 525 connected via the 4:1 mux to the sense amp circuitry 570 and to output a pair of signals (one being the inverse of the other) to the tri-state buffer 580 dependent on the result of that sensing operation. This will cause the tri-state buffer 580 to output a value indicative of the value stored within the relevant memory cell.

The construction of each memory cell in preferred embodiments of the present invention is illustrated in FIG. 4A. As can be seen, each memory cell 610, 620 basically consists of a cross-coupled pair of inverter circuits, each inverter circuit being formed by a P type transistor 540, 550 and an N type transistor 545, 555 connected in series between the first voltage level and the second voltage level. It will be appreciated that memory cells 520, 530 are constructed in the same way, but for clarity in the drawing their detailed construction has been omitted. Each memory cell is coupled to the bit lines 515, 525 by N type transistors 560, 565, respectively, such that when the corresponding word line 500 is driven, these N type transistors conduct and hence connect the memory cell to the pair of bit lines. Elements 800 in FIG. 4A are intended to represent a memory cell and its corresponding two transistors used to connect the memory cell to the corresponding pair of bit lines.

As will be apparent to those skilled in the art, if the voltage level on line 542 is at a logic 0 level, the voltage on line 544 will be at a logic 1 level, and visa versa. These two possible states correspond to the two possible bit values that can be stored in the memory cell. Accordingly, it will be clear that when the transistors 560, 565 are turned on, a current will flow through one of them due to the voltage difference existing across one of them (as mentioned earlier both of the bit lines 515, 525 will have been precharged to a logic 1 level). This will cause the voltage level on one of the bit lines to decrease, and it is this decrease in voltage which is picked up by the sense amp circuitry 570, and used to determine which logic value is stored within the memory cell.

Figure 4B:
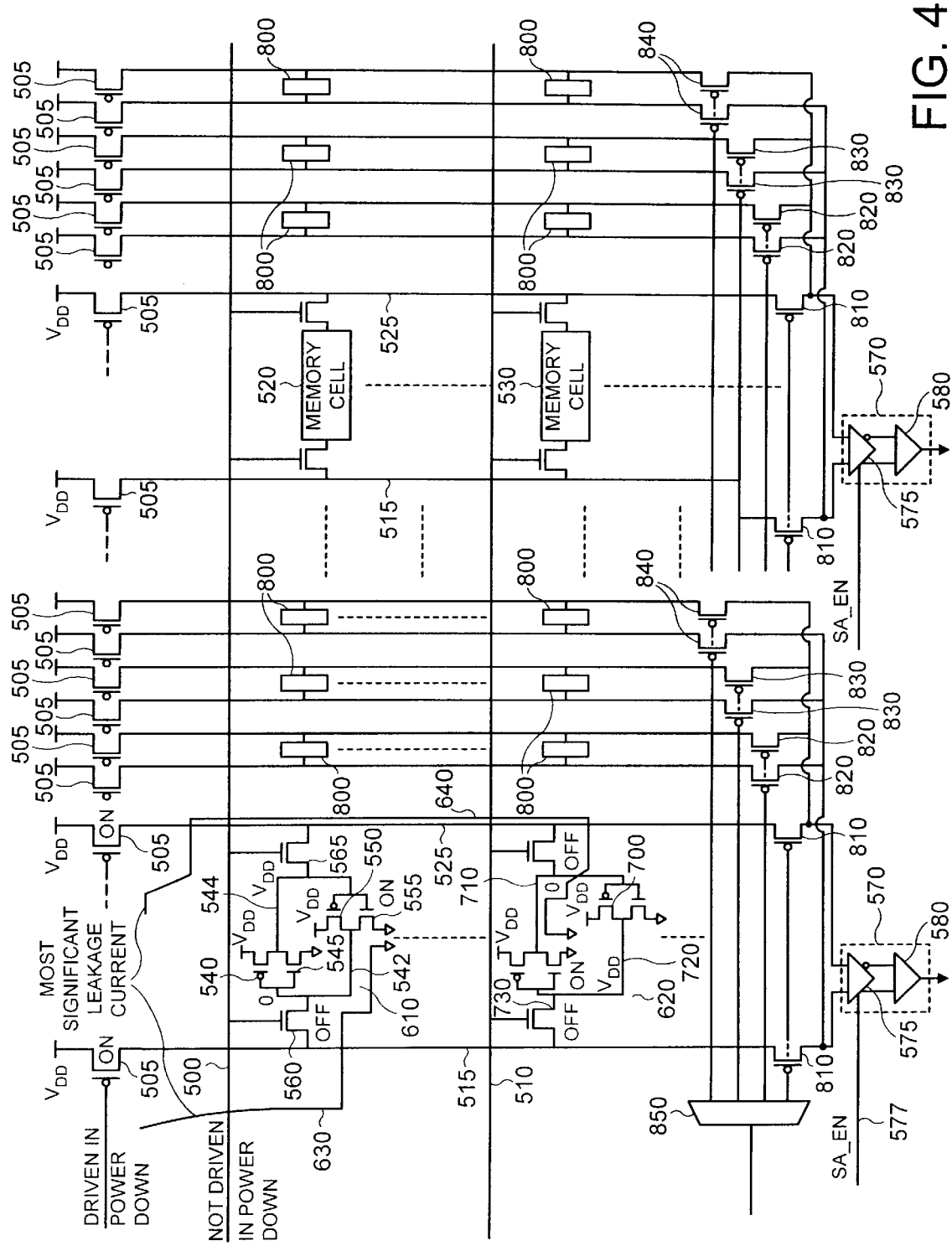
FIG. 4B illustrates the path of the most significant leakage current in the RAM of FIG. 4A.

FIG. 4B illustrates the path of the most significant leakage current when the memory device of FIG. 4A enters a power down mode in accordance with one embodiment of the prior art techniques. It will be appreciated that the path of most significant leakage current will vary depending on the actual embodiment. In this example, it is assumed that the wire 542 is at a logic 0 level and the wire 544 is at a logic 1 level for a first memory cell 610 whilst the opposite is true for a second memory cell 620 in the column. Hence, the memory cell 610 is storing one data value (i.e. a logic 0 or a logic 1 value dependent on the implementation) whilst the second memory cell 620 is storing the other data value (i.e. a logic 1 or a logic 0 value dependent on the implementation). In the prior art approach, the precharge transistors 505 will typically be driven in the power down mode in order to maintain the bit lines at the logic 1 level. However the word lines will not be driven and accordingly the transistors 560, 565 will be turned off. As can be seen from FIG. 4B, for the memory cells 610, leakage current occurs over the path 630 due to the potential difference between the first voltage level and the second voltage level. As the wire 544 is at a logic 1 level, it should be noted that the transistor 555 is also in the ON state, and accordingly the only resistance observed in this path is through transistor 560 which is in the OFF state. Since there is only one transistor in the OFF state along the path 630, the leakage current has been found to be significant.

Similarly, looking at the memory cell 620, the most significant leakage current passes over path 640 and again only one transistor along that path is in the OFF state, this again giving rise to significant leakage current.

Every memory cell in each column will either be storing a logic 0 or a logic 1 value, and accordingly every memory cell within every column will exhibit a leakage current along a path analogous to path 630 or path 640, dependent on the logic value stored in any particular cell.

It may be considered that the appropriate way to reduce this leakage current is to take an approach analogous to that performed for the dynamic node circuits of the select circuitry 100, and hence to discharge each of the bit lines 515, 525 to the second voltage level during a power down mode of operation. However, it would be appreciated that since the voltage levels on the wires 542, 544 of each memory cell are opposite, exactly the same problem will exist, in that there will still be a potential difference across one of the transistors 560, 565 and accordingly a similar leakage current will be observed to that illustrated in FIG. 4B.

This problem is alleviated in preferred embodiments of the present invention by providing power down control circuitry 600 to ensure that in the power down mode, the precharge transistors 505 are turned off, thereby in effect leaving the bit lines 515, 525 floating.

Figure 4C:
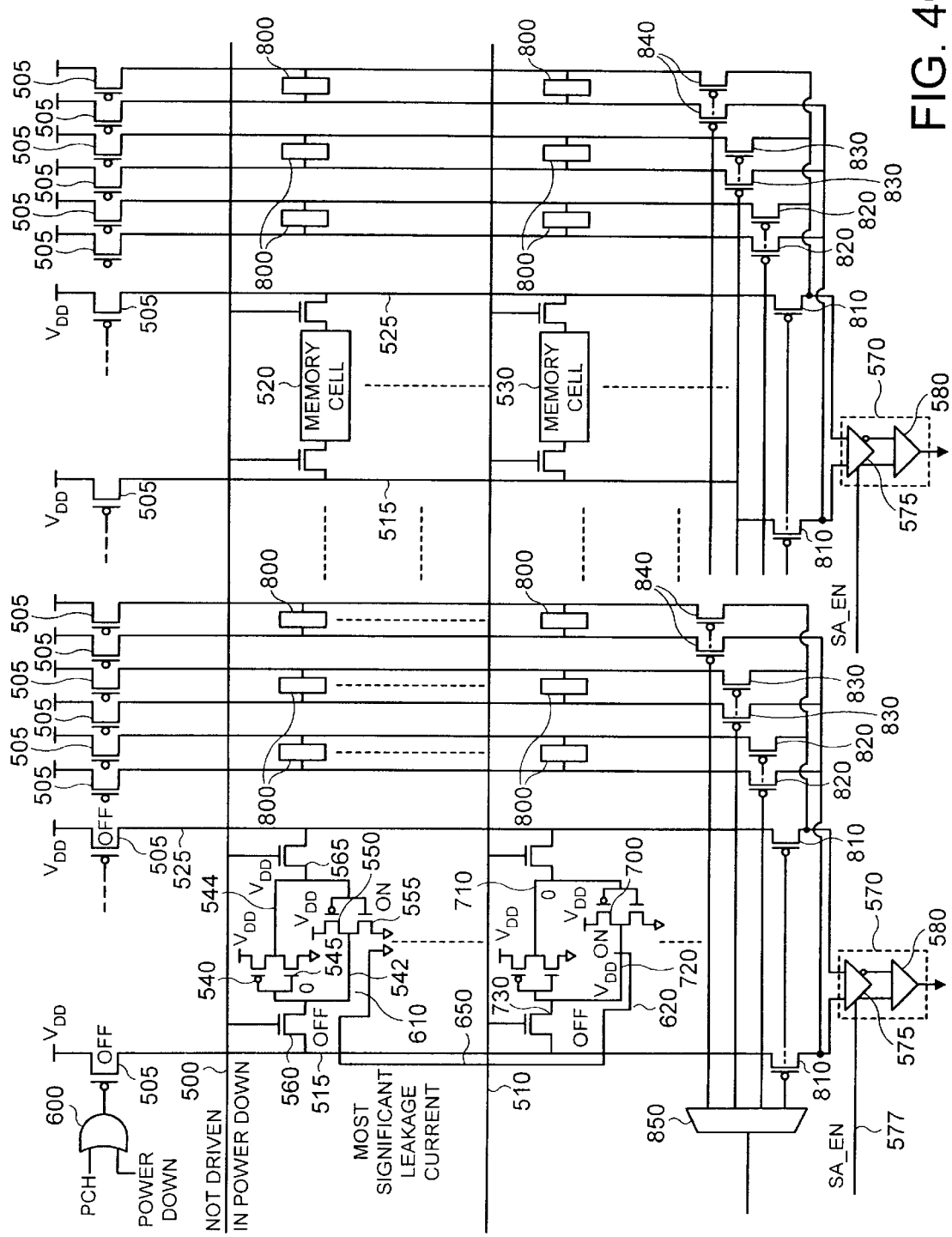
FIG. 4C illustrates the arrangement of the RAM in preferred embodiments of the present invention, and illustrates the path of the most significant leakage current in such an embodiment.

More particularly, as illustrated in FIG. 4C, the power down control circuitry preferably consists of an OR gate 600 which is arranged to receive the precharge signal and the power down signal. When the power down mode is not selected, the power down signal will be at a logic 0 level, and accordingly the output of the OR gate 600 will depend directly on the value of the precharge signal, thereby having no effect on the operation of the memory device. However, when the power down mode is selected, the power down signal will rise to a logic 1 level, which will cause a logic 1 value signal to be output by the OR gate 600 to the gate of each P type transistor 505, thereby turning the precharge transistors 505 off. At this point, the bit lines 515, 525 will still be at the first voltage level, but will no longer be "strongly" driven to the first voltage level. The use of the term "strongly" in this sense is intended to indicate the act of being driven by a "turned on" device (i.e. where the voltage between gate and source exceeds the threshold voltage).

As illustrated in FIG. 4C, the most significant leakage current in this embodiment now occurs over path 650, which is a path between two memory cells in a particular column that store opposing data values. As shown in FIG. 4C, since the value on wire 710 is a logic 0 value, this will cause P type transistor 700 to turn on, thereby causing the first voltage level (i.e. $V_{DD}$) to be present on wire 720. Similarly, since the voltage level on wire 544 is a logic 1 level, this will cause transistor 555 to turn on coupling wire 542 to ground. Accordingly, leakage current will flow via a plurality of transistors 700, 730, 560 and 555, thereby establishing the path 650. It should be noted that in this path there are two transistors in the OFF state, namely transistors 730 and 560, and this hence significantly increases the resistance of the path to ground when compared with the prior art approach of FIG. 4B, where only one transistor in the OFF state exists in the leakage current path. Similar leakage current paths to path 650 will exist between any pair of memory cells in a particular column that store opposing data values. However, due to the increased resistance arising from the presence of two transistors in the OFF state in each such leakage current path, the overall leakage current exhibited by the RAM 110 when in the power down mode is significantly reduced.

To further reduce the leakage current, it is possible to arrange the voltage regulating circuit of FIG. 1 to reduce the difference between the first and second voltage levels (preferably by reducing the value of the voltage $V_{DD}$) when the power down mode is entered.

It will be appreciated that, instead of OR gate 600, the power down control circuitry can be formed by placing a P type transistor in series with each precharge transistor 505 between the first voltage level and the corresponding bit line. This additional P type transistor would be arranged to receive the power down signal, such that when the power down signal is set to a logic 1 level, that transistor would turn off and decouple the corresponding precharge transistor from the first voltage level, thereby preventing the precharge transistor from actively precharging the corresponding bit line.

Although a particular embodiment has been described herein, it will be apparent that the invention is not limited thereto, and that many modifications and additions thereto may be made within the scope of the invention. For example, various combinations of the features of the following dependent claims can be made with the features of the independent claims without departing from the scope of the present invention.

We claim:

1. A memory device, comprising:
   a column of memory cells, each memory cell being arranged to store a data value;
   a pair of bit lines coupled to said column of memory cells;
   bit line precharge circuitry for precharging said pair of bit lines to a predetermined voltage level during a precharge phase, the pair of bit lines being arranged such that, when a particular memory cell in said column is selected in an evaluate phase following said precharge phase, a relative change in voltage level between the pair of bit lines indicates the data value stored within the selected memory cell;
   power down control circuitry arranged when the memory device is to enter a power down mode to prevent the bit line precharge circuitry from precharging said pair of bit lines; and
   selector circuitry arranged when the memory device is to enter said power down mode to ensure that none of said memory cells in said column are selected.

2. A memory device as claimed in claim 1, wherein the power down control circuitry is arranged to receive a power down signal indicating whether the power down mode is set and a precharge signal indicating whether the precharge phase is active, and to generate as its output an input signal to the bit line precharge circuitry, such that when the power down signal indicates that the power down mode is set, the output signal from the power down control circuitry is arranged to cause the bit line precharge circuitry to be turned off.

3. A memory device as claimed in claim 2, wherein the bit line precharge circuitry comprises one or more P type devices, and said power down control circuitry is arranged to apply a logical OR gate function to the power down signal and the precharge signal.

4. A memory device as claimed in claim 1, wherein the power down control circuitry is positioned in series with the bit line precharge circuitry between the pair of bit lines and the predetermined voltage level, the power down control circuitry being arranged to receive a power down signal indicating whether the power down mode is set and to turn off when the power down signal indicates that the power down mode is set, thereby preventing the bit line precharge circuitry from precharging said pair of bit lines to said predetermined voltage level.

5. A memory device as claimed in claim 1, wherein said memory cells are RAM cells.

6. A memory device as claimed in claim 5, wherein each memory cell comprises a cross-coupled pair of inverter circuits.

7. A memory device as claimed in claim 1, wherein each memory cell is coupled to each bit line in said pair of bit lines via a memory cell select device, the selector circuitry being arranged to ensure that each memory cell select device is turned off when the memory device is in said power down mode.

8. A memory device as claimed in claim 1, further comprising voltage regulating circuitry arranged when the memory device is to enter the power down mode to reduce the difference between the predetermined voltage level and a reference voltage level.

9. A memory device as claimed in claim 1, wherein a plurality of pairs of bit lines are coupled to said column of memory cells.

10. A memory device as claimed in claim 1, further comprising:
    a plurality of said columns of memory cells;
    a corresponding plurality of said pairs of bit lines;
    a plurality of word lines, each word line being coupled to one of said memory cells in each column;
    said selector circuitry being arranged to drive one of said word lines in said evaluate phase to cause the memory cells coupled to that word line to be selected.

11. A memory device, comprising:
    a column of memory cells, each memory cell being arranged to store a data value;
    a pair of bit lines coupled to said column of memory cells;
    bit line precharge circuitry for precharging said pair of bit lines to a predetermined voltage level during a precharge phase, the pair of bit lines being arranged such that, when a particular memory cell in said column is selected in an evaluate phase following said precharge phase, a relative change in voltage level between the pair of bit lines indicates the data value stored within the selected memory cell;
    power down control circuitry arranged when the memory device is to enter a power down mode to prevent the bit line precharge circuitry from precharging said pair of bit lines;
    selector circuitry arranged when the memory device is to enter said power down mode to ensure that none of said memory cells in said column are selected;
    a plurality of said columns of memory cells;
    a corresponding plurality of said pairs of bit lines;
    a plurality of word lines, each word line being coupled to one of said memory cells in each column;
    said selector circuitry being arranged to drive one of said word lines in said evaluate phase to cause the memory cells coupled to that word line to be selected,
    wherein said selector circuitry comprises;
       a dynamic node coupled to a corresponding word line;
       dynamic node precharge circuitry arranged during said precharge phase to precharge the dynamic node to a first voltage level;
       evaluation circuitry arranged to receive a number of input signals and during said evaluate phase to selectively drive the dynamic node to a second voltage level dependent on the input signals; and
       power down drive circuitry arranged when the selector circuitry is to enter a power down mode to drive the dynamic node to the second voltage level.

12. A memory device as claimed in claim 11, further comprising:

coupling logic arranged to couple said dynamic node to said corresponding word line, such that in said evaluate phase if said evaluation circuitry drives said dynamic node to said second voltage level, the corresponding word line is not driven.

13. A memory device as claimed in claim 11, wherein the power down drive circuitry comprises first circuitry responsive to a power down signal indicating that the power down mode is set to drive the dynamic node to the second voltage level and second circuitry responsive to said power down signal to prevent the dynamic node precharge circuitry from precharging the dynamic node to the first voltage level.

14. A memory device as claimed in claim 13, wherein the first circuitry comprises an N type device connected between the dynamic node and the second voltage level.

15. A memory device as claimed in claim 13, wherein the second circuitry is arranged to receive the power down signal and a precharge signal indicating whether the precharge phase is active, and to generate as its output an input signal to the dynamic node precharge circuitry, such that when the power down signal indicates that the power down mode is set, the output signal from the second circuitry is arranged to cause the dynamic node precharge circuitry to be turned off.

16. A memory device as claimed in claim 15, wherein the dynamic node precharge circuitry comprises one or more P type devices, and said second circuitry is arranged to apply a logical OR gate function to the power down signal and the precharge signal.

17. A memory device as claimed in claim 13, wherein the second circuitry is positioned in series with the dynamic node precharge circuitry between the dynamic node and the first voltage level, the second circuitry being arranged to turn off when the power down signal indicates that the power down mode is set, thereby preventing the dynamic node precharge circuitry from precharging the dynamic node to the first voltage level.

18. A memory device as claimed in claim 11, wherein the first voltage level represents a logic 1 level and the second voltage level represents a logic 0 level.

19. A memory device as claimed in claim 11, wherein the evaluation circuitry comprises a plurality of N type devices.

20. A memory device as claimed in claim 19, wherein the dynamic node precharge circuitry comprises one or more P type devices.

21. A memory device as claimed in claim 11, further comprising voltage regulating circuitry arranged when the selector circuitry is to enter the power down mode to reduce the difference between the first voltage level and the second voltage level, thereby reducing leakage current through the dynamic node precharge circuitry.

22. A method of operating a memory device to reduce leakage current in a power down mode of operation, the memory device comprising a column of memory cells, each memory cell being arranged to store a data value, a pair of bit lines coupled to said column of memory cells, and bit line precharge circuitry for precharging said pair of bit lines to a predetermined voltage level during a precharge phase, the pair of bit lines being arranged such that, when a particular memory cell in said column is selected in an evaluate phase following said precharge phase, a relative change in voltage level between the pair of bit lines indicates the data value stored within the selected memory cell, the method comprising the steps of:

(a) preventing the bit line precharge circuitry from precharging said pair of bit lines when the memory device is to enter a power down mode; and (b) ensuring that none of said memory cells in said column are selected when the memory device is to enter said power down mode.

23. A method as claimed in claim 22, wherein said step (a) comprises the steps of:

arranging power down control circuitry to receive a power down signal indicating whether the power down mode is set and a precharge signal indicating whether the precharge phase is active; and causing said power down circuitry to generate as its output an input signal to the bit line precharge circuitry, such that when the power down signal indicates that the power down mode is set, the output signal from the power down control circuitry is arranged to cause the bit line precharge circuitry to be turned off.

24. A method as claimed in claim 23, wherein the bit line precharge circuitry comprises one or more P type devices, and said power down control circuitry is arranged to apply a logical OR gate function to the power down signal and the precharge signal.

25. A method as claimed in claim 22, wherein power down control circuitry is positioned in series with the bit line precharge circuitry between the pair of bit lines and the predetermined voltage level, at said step (a) the power down control circuitry being arranged to receive a power down signal indicating whether the power down mode is set and to turn off when the power down signal indicates that the power down mode is set, thereby preventing the bit line precharge circuitry from precharging said pair of bit lines to said predetermined voltage level.

26. A method as claimed in claim 22, wherein said memory cells are RAM cells.

27. A method as claimed in claim 26, wherein each memory cell comprises a cross-coupled pair of inverter circuits.

28. A method as claimed in claim 22, wherein each memory cell is coupled to each bit line in said pair of bit lines via a memory cell select device, the selector circuitry being arranged to ensure that each memory cell select device is turned off when the memory device is in said power down mode.

29. A method as claimed in claim 22, further comprising the step of:

reducing the difference between the predetermined voltage level and a reference voltage level when the memory device is to enter the power down mode.

30. A method as claimed in claim 22, wherein a plurality of pairs of bit lines are coupled to said column of memory cells.

31. A method as claimed in claim 22, wherein said memory device further comprises a plurality of said columns of memory cells, a corresponding plurality of said pairs of bit lines, a plurality of word lines, each word line being coupled to one of said memory cells in each column, and selector circuitry arranged to drive one of said word lines in said evaluate phase to cause the memory cells coupled to that word line to be selected.

32. A method of operating a memory device to reduce leakage current in a power down mode of operation, the memory device comprising a column of memory cells, each memory cell being arranged to store a data value, a pair of bit lines coupled to said column of memory cells, and bit line precharge circuitry for precharging said pair of bit lines to a predetermined voltage level during a precharge phase, the pair of bit lines being arranged such that, when a particular memory cell in said column is selected in an evaluate phase following said precharge phase, a relative change in voltage level between the pair of bit lines indicates the data value stored within the selected memory cell, the method comprising the steps of:

(a) preventing the bit line precharge circuitry from precharging said pair of bit lines when the memory device is to enter a power down mode; and (b) ensuring that none of said memory cells in said column are selected when the memory device is to enter said power down mode, wherein said memory device further comprises a plurality of said columns of memory cells, a corresponding plurality of said pairs of bit lines, a plurality of word lines, each word line being coupled to one of said memory cells in each column, and selector circuitry arranged to drive one of said word lines in said evaluate phase to cause the memory cells coupled to that word line to be selected, wherein said selector circuitry comprises a dynamic node coupled to a corresponding word line, dynamic node precharge circuitry arranged during said precharge phase to precharge the dynamic node to a first voltage level, and evaluation circuitry arranged to receive a number of input signals and during said evaluate phase to selectively drive the dynamic node to a second voltage level dependent on the input signals, the method further comprising the step of:
driving the dynamic node to the second voltage level when the selector circuitry is to enter a power down mode.

33. A method as claimed in claim 32, further comprising the step of:

coupling said dynamic node to said corresponding word line, such that in said evaluate phase if said evaluation circuitry drives said dynamic node to said second voltage level, the corresponding word line is not driven.

34. A method as claimed in claim 32, wherein said driving step comprises the steps of:

(a) responsive to a power down signal indicating that the power down mode is set, causing first circuitry to drive the dynamic node to the second voltage level; and (b) responsive to said power down signal, causing second circuitry to prevent the dynamic node precharge circuitry from precharging the dynamic node to the first voltage level.

35. A method as claimed in claim 34, wherein the first circuitry comprises an N type device connected between the dynamic node and the second voltage level.

36. A method as claimed in claim 34, wherein said step (b) comprises the steps of:

receiving at said second circuitry the power down signal and a precharge signal indicating whether the precharge phase is active; and generating as an output of the second circuitry an input signal to the dynamic node precharge circuitry, such that when the power down signal indicates that the power down mode is set, the output signal from the second circuitry is arranged to cause the dynamic node precharge circuitry to be turned off.

37. A method as claimed in claim 36, wherein the dynamic node precharge circuitry comprises one or more P type devices, and said second circuitry is arranged to apply a logical OR gate function to the power down signal and the precharge signal.

38. A method as claimed in claim 34, wherein the second circuitry is positioned in series with the dynamic node precharge circuitry between the dynamic node and the first voltage level, at said step (b) the second circuitry being arranged to turn off when the power down signal indicates that the power down mode is set, thereby preventing the dynamic node precharge circuitry from precharging the dynamic node to the first voltage level.

39. A method as claimed in claim 32, wherein the first voltage level represents a logic 1 level and the second voltage level represents a logic 0 level.

40. A method as claimed in claim 32, wherein the evaluation circuitry comprises a plurality of N type devices.

41. A method as claimed in claim 40, wherein the dynamic node precharge circuitry comprises one or more P type devices.

42. A method as claimed in claim 32, further comprising the step of:

reducing the difference between the first voltage level and the second voltage level when the selector circuitry is to enter the power down mode, thereby reducing leakage current through the dynamic node precharge circuitry.

* * * * *